(12) United States Patent
Kumagai et al.

(10) Patent No.: US 12,112,943 B2
(45) Date of Patent: Oct. 8, 2024

(54) METHOD FOR FORMING FILM AND PROCESSING APPARATUS

(71) Applicant: Tokyo Electron Limited, Tokyo (JP)

(72) Inventors: Keita Kumagai, Yamanashi (JP); Hiroto Fujikawa, Yamanashi (JP); Ryo Watanabe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 36 days.

(21) Appl. No.: 17/656,324

(22) Filed: Mar. 24, 2022

(65) Prior Publication Data

US 2022/0319843 A1    Oct. 6, 2022

(30) Foreign Application Priority Data

Apr. 5, 2021 (JP) .................................. 2021-063969

(51) Int. Cl.
*H01L 21/02*    (2006.01)
*C23C 16/02*    (2006.01)
*C23C 16/38*    (2006.01)

(52) U.S. Cl.
CPC .... *H01L 21/02458* (2013.01); *C23C 16/0272* (2013.01); *C23C 16/38* (2013.01); *H01L 21/02123* (2013.01); *H01L 21/02532* (2013.01); *H01L 21/0254* (2013.01)

(58) Field of Classification Search
CPC ......... H01L 21/02112; H01L 21/02271; H01L 21/02488; H01L 21/02532; H01L 21/0254; C23C 16/0272; C23C 16/38
See application file for complete search history.

(56) References Cited

U.S. PATENT DOCUMENTS

2010/0098884 A1*    4/2010    Balseanu .............. C23C 16/342
                                                                427/579

FOREIGN PATENT DOCUMENTS

JP        2017-210640        11/2017

* cited by examiner

*Primary Examiner* — Joseph A Miller, Jr.
(74) *Attorney, Agent, or Firm* — IPUSA, PLLC

(57) ABSTRACT

A method for forming a film that includes forming a boron nitride film on a substrate, and forming a boron-containing silicon film on the boron nitride film.

5 Claims, 8 Drawing Sheets

FIG.7

| FILM | BASE | BEFORE HEAT TREATMENT | AFTER HEAT TREATMENT |
|---|---|---|---|
| BN FILM (20 nm) + B-Si FILM (580 nm) | SiN FILM | OK | OK |
| | SiCN FILM | OK | OK |

FIG.8

| FILM | BASE | BEFORE HEAT TREATMENT | AFTER HEAT TREATMENT |
|---|---|---|---|
| B-Si FILM (580 nm) | SiN FILM | PEELED OFF | PEELED OFF |
| | SiCN FILM | PEELED OFF | PEELED OFF |

FIG.9

| FILM | BASE | BEFORE HEAT TREATMENT | AFTER HEAT TREATMENT | COMMENT |
|---|---|---|---|---|
| a-Si FILM (20 nm) + B-Si FILM (580 nm) | SiN FILM | OK | PEELED OFF | PEELED OFF AT BEVEL |
| | SiCN FILM | OK | OK | - |

METHOD FOR FORMING FILM AND PROCESSING APPARATUS

CROSS-REFERENCE TO RELATED APPLICATIONS

The present application is based on and claims priority to Japanese Patent Application No. 2021-063969 filed on Apr. 5, 2021, the contents of which are incorporated herein by reference in their entirety.

TECHNICAL FIELD

The disclosures herein generally relate to a method for forming a film, and a processing apparatus.

BACKGROUND

A technique of forming a carbon film after forming a seed layer composed of a boron-based thin film on a surface of a wafer, is known (see, for example, Japanese Unexamined Patent Application Publication No. 2017-210640).

SUMMARY

According to an embodiment, a method for forming a film, the method includes: forming a boron nitride film on a substrate, and forming a boron-containing silicon film on the boron nitride film.

BRIEF DESCRIPTION OF THE DRAWINGS

FIG. 7 is a diagram illustrating a result of the evaluation of the adhesion of the B—Si film;

FIG. 8 is a diagram illustrating a result of the evaluation of the adhesion of the B—Si film; and FIG. 9 is a diagram illustrating a result of the evaluation of the adhesion of the B—Si film.

DETAILED DESCRIPTION

Figure 1:
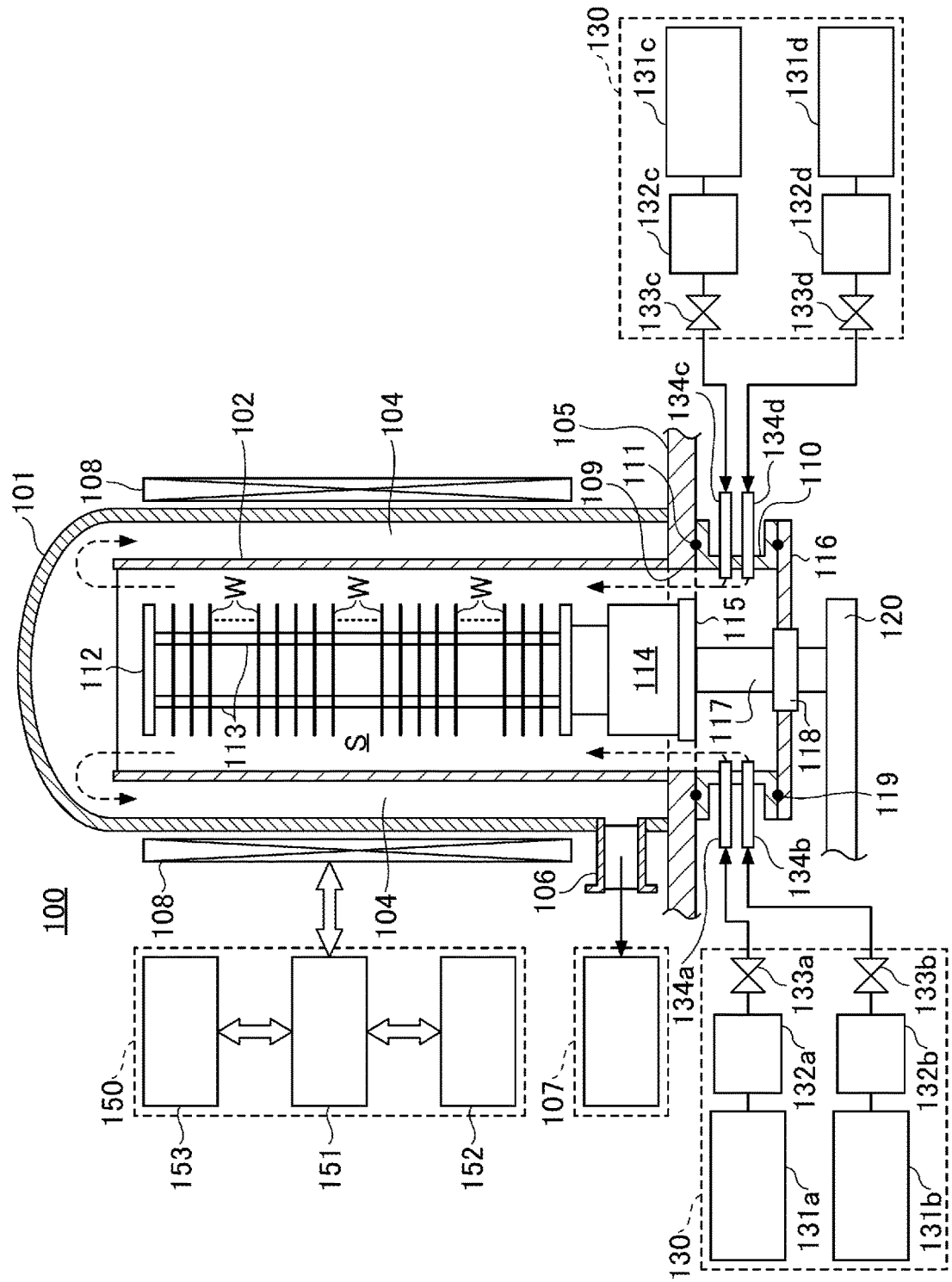
FIG. 1 is a diagram illustrating an outline of an example of a processing apparatus according to an embodiment.

Hereinafter, non-limiting exemplary embodiments of the present disclosure will be described with reference to the accompanying drawings. In the drawings, the same or corresponding parts or components are designated by the same or corresponding reference numerals, and the description thereof will be omitted.

[Processing Apparatus]

Referring to FIG. 1, an example of a processing apparatus according to an embodiment will be described.

A processing apparatus 100 is configured as a vertical batch-type film forming apparatus. The processing apparatus 100 includes a cylindrical outer tube 101 having a ceiling and a cylindrical inner tube 102 disposed inside the outer tube 101. The outer tube 101 and the inner tube 102 are made of, for example, quartz. The inner region of the inner tube 102 is a processing chamber S in which a plurality of substrates W to be processed are processed together. A substrate W may be, for example, a semiconductor wafer.

The outer tube 101 and the inner tube 102 are horizontally separated from each other by an annular space 104. The outer tube 101 and the inner tube 102 are bonded to a base material 105 at their lower ends. The upper end of the inner tube 102 is separated from the ceiling portion of the outer tube 101 so that the space above the processing chamber S is communicated with the annular space 104. The annular space 104, communicating with the space above the processing chamber S, serves as an exhaust path. The gas supplied and diffused in the processing chamber S flows from below the processing chamber S to above the processing chamber S and is sucked into the annular space 104. An exhaust line 106 is connected to, for example, the lower end of the annular space 104. The exhaust line 106 is connected to an exhaust device 107. The exhaust device 107 includes a vacuum pump and the like. The exhaust device 107 evacuates the processing chamber S, and adjusts the internal pressure of the processing chamber S to an appropriate pressure for processing.

A heating device 108 is provided on the outside of the outer tube 101 to surround the processing chamber S. The heating device 108 adjusts the temperature inside the processing chamber S to an appropriate temperature for processing, and heats a plurality of substrates W at the same time.

The lower portion of the processing chamber S communicates with an opening 109 provided in the base material 105. To the opening 109, for example, a manifold 110 cylindrically shaped with stainless steel is connected via a sealing member 111 such as an O-ring. The lower end of the manifold 110 is an opening through which a boat 112 is inserted into the processing chamber S. The boat 112 is made of quartz, for example. The boat 112 has a plurality of rods 113. Grooves (not shown) are formed in the rod 113 to simultaneously support a plurality of substrates to be processed. Accordingly, multiple (for example, 50 to 150) substrates W can be placed in multiple steps in the boat 112. When the boat 112 having a plurality of substrates W mounted therein is inserted into the processing chamber S, a plurality of substrates W are accommodated inside the processing chamber S.

The boat 112 is mounted on a table 115 via a heat insulating tube 114 made of quartz. The table 115 is supported on a rotating shaft 117. The rotating shaft 117 penetrates a lid 116 formed, for example, of stainless steel. The lid 116 opens and closes the opening at the lower end of the manifold 110. A magnetic fluid seal 118, for example, is provided at the penetrating portion of the lid 116. The magnetic fluid seal 118 airtightly seals and rotatably support the rotating shaft 117. A sealing member 119, for example, made of an O-ring, is provided between the periphery of the lid 116 and the lower end of the manifold 110 to maintain the airtightness within the processing chamber S. The rotating shaft 117 is mounted to the tip of an arm 120. The arm 120 is supported by a lifting mechanism (not shown), such as a boat elevator. The boat 112, the lid 116, and the like are integrally elevated and lowered vertically, and are inserted into and removed from the processing chamber S.

The processing apparatus 100 includes a process gas supply 130 for supplying a process gas into the processing chamber S. In the present embodiment, the process gas supply 130 includes a boron-containing gas supply 131a, a nitrogen-containing gas supply 131b, a silicon-containing gas supply 131c, and an inert gas supply 131d.

The boron-containing gas supply 131a is connected to a gas supply port 134a via a flow controller (MFC) 132a and an open/close valve 133a. The nitrogen-containing gas supply 131b is connected to a gas supply port 134b via a flow controller (MFC) 132b and an open/close valve 133b. The silicon-containing gas supply 131c is connected to a gas supply port 134c via a flow controller (MFC) 132c and an open/close valve 133c. The inert gas supply 131d is connected to a gas supply port 134d via a flow controller (MFC) 132d and an open/close valve 133d. Each of the gas supply ports 134a to 134d are provided to penetrate side walls of the manifold 110 horizontally to diffuse the supplied gas into the interior of the processing chamber S above the manifold 110.

The boron-containing gas supplied from the boron-containing gas supply 131a is used, for example, to form a boron-containing silicon film (B—Si film) by thermal CVD. In addition, the boron-containing gas supplied from the boron-containing gas supply 131a is used to form a boron nitride film (BN film) on the base by thermal CVD in order to improve adhesion between the base and the B—Si film. As the boron-containing gas, for example, a borane-based gas such as diborane ($B_2H_6$), boron trichloride ($BCl_3$), and a gas obtained by diluting these gases with hydrogen ($H_2$), nitrogen ($N_2$), and the like may be used.

The nitrogen-containing gas supplied from the nitrogen-containing gas supply 131b is used, for example, with the boron-containing gas, to form a BN film. As the nitrogen-containing gas, one or more gases selected from the group consisting of, for example, ammonia ($NH_3$), diazene ($N_2H_2$), hydrazine ($N_2H_4$), an organic hydrazine compound such as monomethylhydrazine ($CH_3(NH)NH_2$), and the like may be used.

The silicon-containing gas supplied from the silicon-containing gas supply 131c is used, for example, with the boron-containing gas, to form a B—Si film. As the silicon-containing gas, one or more gases selected from the group consisting of, for example, monosilane ($SiH_4$), disilane ($Si_2H_6$), hexachlorodisilane (HCD), dichlorosilane (DCS), hexaethylaminodisilane, hexamethyldisilazane (HMDS), tetrachlorosilane (TCS), disilylanine (DSA), trisilylamine (TSA), and bistertiary butylaminosilane (BTBAS) may be used.

The inert gas supplied from the inert gas supply 131d is used, for example, to purge the processing chamber S. As the inert gas, for example, $N_2$ gas or a rare gas such as Ar gas may be used.

The processing apparatus 100 includes a controller 150. The controller 150 includes a process controller 151 comprised of, for example, a microprocessor (computer). The process controller 151 controls each component of the processing apparatus 100. A user interface 152 and a storage unit 153 are connected to the process controller 151.

User interface 152 includes an input unit and a display unit. The input unit includes a touch panel display, keyboard, and the like for an operator to perform command input operations and the like for managing the processing apparatus 100. The display unit includes a display and the like for visualizing and displaying operation status of the processing apparatus 100.

The storage unit 153 stores what is known as a process recipe. The process recipe includes a control program for implementing various processes executed by the processing apparatus 100 under the control of the process controller 151, and a program for executing processes according to processing conditions in each component of the processing apparatus 100. The process recipe is stored in a storage medium in the storage unit 153. The storage medium may be a hard disk, a semiconductor memory, or a portable one such as a CD-ROM, a DVD, a flash memory, and the like. The process recipe may also be suitably transmitted from other devices, for example, via a dedicated line.

The process recipe is read from the storage unit 153 according to an operator's instruction or the like from the user interface 152 as necessary. The process controller 151 causes the processing apparatus 100 to execute processes according to the read-out process recipe.

[Method for Forming a Film]

Figure 2:
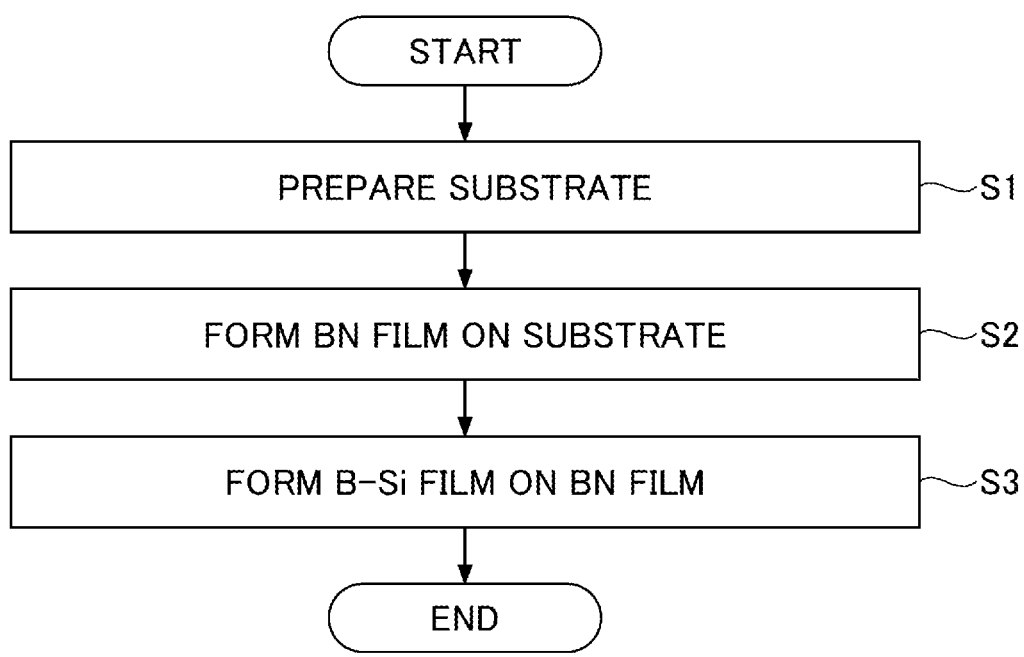
FIG. 2 is a flow chart illustrating an example of a method for forming a film according to the embodiment.
Figure 3A:
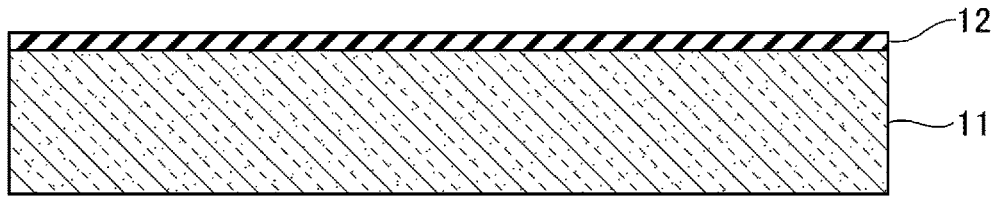
FIGS. 3A to 3C are cross-sectional views illustrating a process of an example of the method for forming a film according to the embodiment.
Figure 3B:
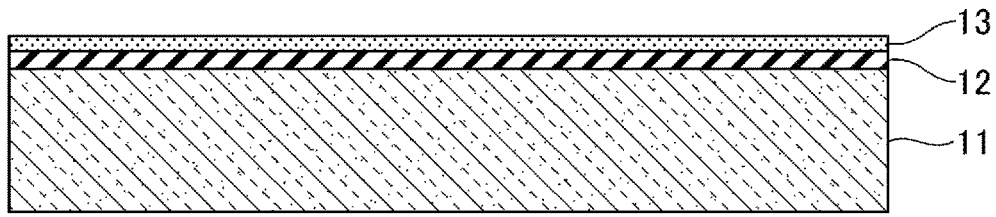
Figure 3C:
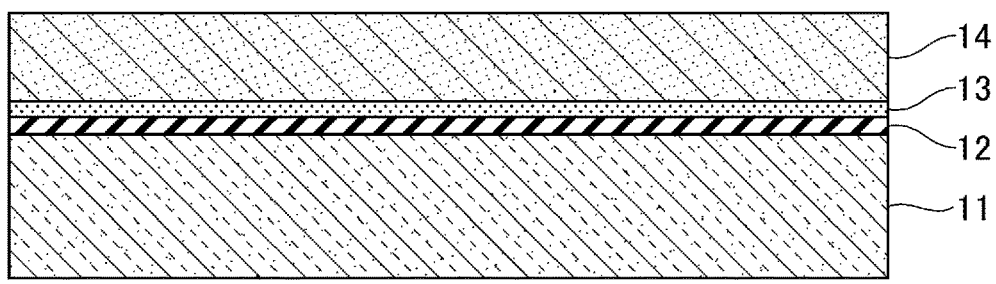
Figure 4:
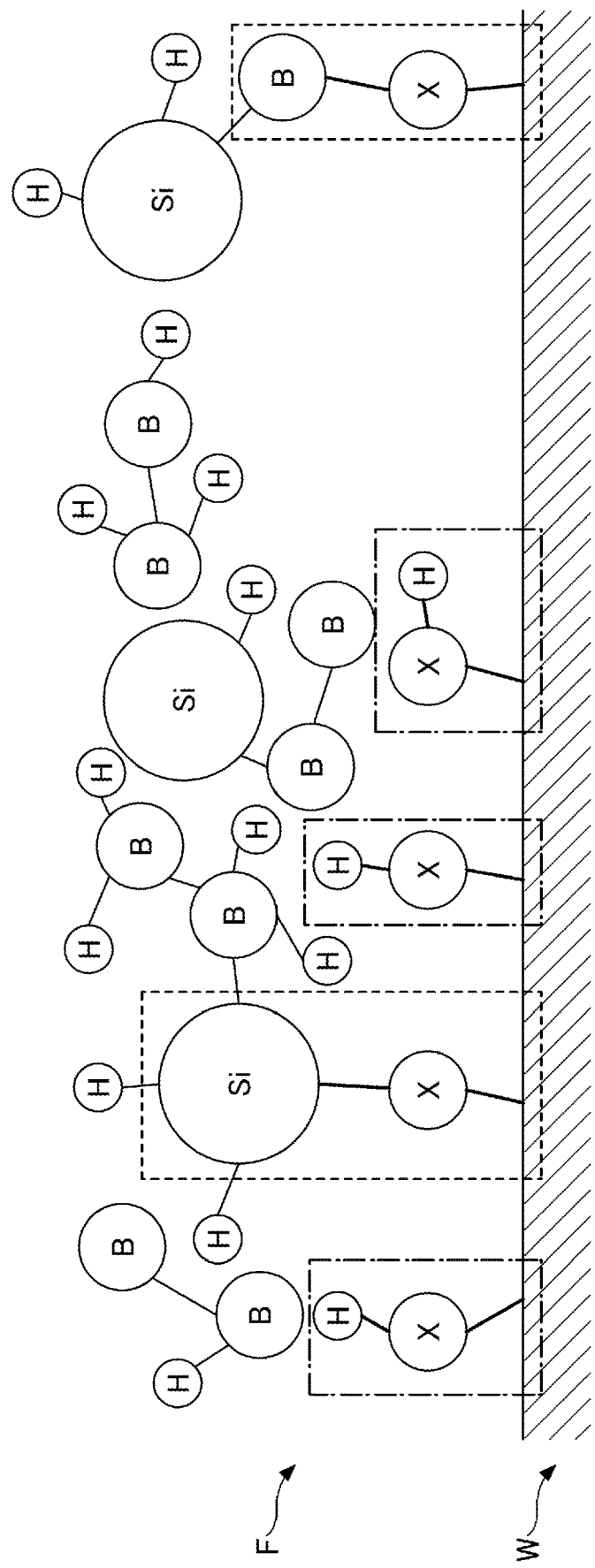
FIG. 4 is a diagram illustrating a bonding state at a surface of a substrate.

Referring to FIGS. 2 to 4, a method for forming a film according to the embodiment will be described by exemplifying a case where the method is performed by the processing apparatus 100 described above. The method for forming a film according to the embodiment may be performed by an apparatus different from the processing apparatus 100 described above.

The method for forming a film according to the embodiment includes Step S1 of preparing a substrate, Step S2 of forming a BN film on the substrate, and Step S3 of forming a B—Si film on the EN film, as shown in FIG. 2.

In step S1 of preparing the substrate, as illustrated in FIG. 3A, a substrate W having a base 12 formed on a base body 11 is prepared. In the present embodiment, a plurality of substrates W (for example, 50 to 150) having a base 12 formed on the base body 11 are mounted on the boat 112. By inserting the boat 112 into the processing chamber S of the processing apparatus 100 from below, a plurality of substrates W are installed in the processing chamber S. Subsequently, by closing the lower end opening of the manifold 110 by the lid 116, the inside of the processing chamber S becomes a closed space. In this state, the inside of the processing chamber S is evacuated and maintained in a predetermined depressurized atmosphere, the temperature of the substrate is raised and maintained at a process temperature by controlling power supply to the heating device 108, and the boat 112 is rotated. The base 12 may be, for example, a SiN film or a SiCN film.

In step S2 of forming the BN film, a BN film 13 is formed on the base 12, for example, by thermal CVD, as illustrated in FIG. 3B. In the present embodiment, the BN film 13 is formed on the base 12 by supplying boron-containing gas from the boron-containing gas supply 131a to the processing chamber S and nitrogen-containing gas from the nitrogen-containing gas supply 131b to the processing chamber S. As the boron-containing gas, for example, a borane-based gas such as $B_2H_6$, $BCl_3$, and a gas obtained by diluting these gases with $H_2$, $N_2$, and the like may be used. As the nitrogen-containing gas, one or more gases selected from the group consisting of, for example, $NH_3$, $N_2H_2$, $N_2H_4$, and an organic hydrazine compound such as $CH_3(NH)NH_2$, and the like may be used. The temperature of the substrate W in forming the BN film 13 may be, for example, 250° C. to 400° C.

In step S3 of forming the B—Si film, a B—Si film 14 is formed on the BN film 13, for example, by thermal CVD, as illustrated in FIG. 3C. In the present embodiment, the B—Si film 14 is formed on the BN film 13 by supplying the boron-containing gas from the boron-containing gas supply 131a to the processing chamber S and the silicon-containing gas from the silicon-containing gas supply 131c to the processing chamber S. As the boron-containing gas, for example, the same type of gas as the boron-containing gas used in step S2 of forming the BN film may be used. As the boron-containing gas, for example, a different type of gas from the boron-containing gas used in step S2 of forming the BN film may be used. As the silicon-containing gas, one or more gases selected from the group consisting of, for example, $SiH_4$, $Si_2H_6$, HCD, DCS, hexaethylaminodisilane, HMDS, TCS, DSA, TSA, and BTBAS may be used. The temperature of the substrate W in forming the B—Si film may be, for example, 250° C. to 400° C.

After forming the B—Si film of the desired thickness, the processing chamber S is evacuated by the exhaust device 107, and an inert gas is supplied from the inert gas supply 131d to the processing chamber S to purge the processing chamber S. As the inert gas, for example, $N_2$ gas or a rare gas such as Ar gas may be used. Subsequently, after returning the processing chamber S to atmospheric pressure, the boat 112 is lowered to carry out the substrate W.

The adhesion between the substrate and the film depends on the hydrogen (H) concentration of the film. For example, as illustrated in FIG. 4, when the H concentration of the film formed on the substrate W is high, the adhesion between the substrate W and a film F is considered to be weakened because bonding by intermolecular forces (dashed-dotted lines in FIG. 4) occurs in addition to the covalent bond (dashed lines in FIG. 4) between the substrate and the film. In FIG. 4, X represents an element (for example, Si) on the surface of the substrate W. For example, the H concentration of the B—Si film 14 formed in above-described step S3 of forming the B—Si film is relatively high (about 10% to 20%). Therefore, when the B—Si film 14 is formed on the base 12, the adhesion between the base 12 and the B—Si film 14 tends to be weakened.

In contrast, in the method for forming a film according to the embodiment, the B—Si film 14 is formed on the BN film 13 after the EN film 13 is formed on the base 12. An elemental analysis indicates that the BN film 13 has B:50% and N:50% and contains little or no hydrogen (H). In other words, by the method for forming a film according to the embodiment, at the formation of the B—Si film 14 on the base 12, the BN film 13 containing little or no H in the film is inserted between the base 12 and the B—Si film 14. Therefore, the B—Si film 14 having good adhesion can be formed.

Further, by the method for forming a film according to the embodiment, there is no or little temperature difference between the film-forming temperature in step S2 of forming the BN film and the film-forming temperature in step S3 of forming the B—Si film. Accordingly, when performing step S2 of forming the BN film and step S3 of forming the B—Si film in the same processing chamber S, the time needed to change the temperature can be shortened, thereby improving the productivity. In addition, it is possible to prevent peeling of the B—Si film accumulated on a dummy substrate.

[Application Example of B—Si Film]

Figure 5:
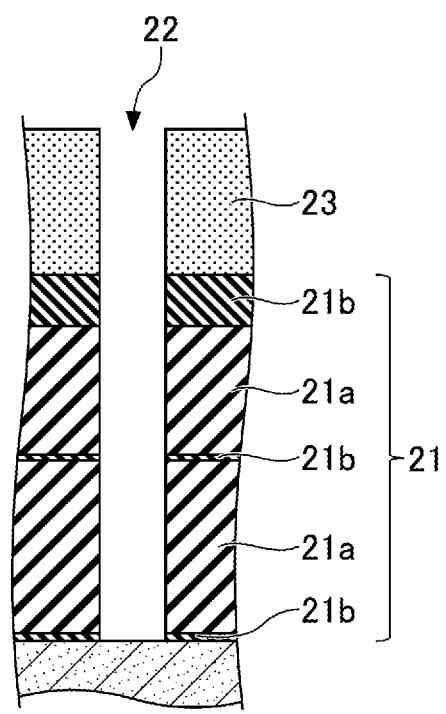
FIG. 5 is a diagram partially illustrating an example of a semiconductor device in which a B—Si film is used in a manufacturing process.

Referring to FIG. 5, an application example of the B—Si film formed by the method for forming a film according to the embodiment will be described. FIG. 5 is a diagram partially illustrating an example of a semiconductor device in which the B—Si film is used in a manufacturing process. FIG. 5 partially illustrates the manufacturing process of a Dynamic Random Access Memory (DRAM).

As illustrated in FIG. 5, the B—Si film formed by the method for forming a film according to the embodiment is used, for example, as a hard mask 23 when etching an interlayer insulating film 21 to form a capacitor hole 22 in the manufacturing process of the DRAM. When forming the capacitor hole 22, a technique for etching a hole with a very high aspect ratio (depth/pore size) is required. In the example illustrated in FIG. 5, the interlayer insulating film 21 is a stacked film of the $SiO_2$ film 21a and the SiN film 21b.

Conventionally, an amorphous silicon (a-Si) film is used as the hard mask 23. When etching the interlayer insulating film 21, also the a-Si film may be slightly etched. As the aspect ratio of the capacitor hole 22 increases, the time in which the a-Si film is exposed to the etching gas increases and the etched amount increases. Therefore, by increasing the thickness of the a-Si film, the function as the hard mask 23 is maintained.

In contrast, when the B—Si film formed by the method for forming a film according to the embodiment is used, a selective ratio for the interlayer insulating film 21 is higher as compared with the case where the a-Si film is used. Thus, the hard mask 23 can be made thinner. Further, in the method for forming a film according to the embodiment, the B—Si film as the hard mask 23 is formed on the BN film after the BN film is formed on the base (the interlayer insulating film 21). Thus, the B—Si film having excellent adhesion can be formed. By the method for forming a film according to the embodiment, as the hard mask 23 used in the manufacturing process of the DRAM, the B—Si film having a thin film thickness and good adhesion with the base can be provided.

EXAMPLE

First, Example will be described in which the adhesion of the B—Si film formed by the method for forming a film according to the embodiment is evaluated. In Example, a silicon wafer having a SiN film formed on the surface and a silicon wafer having a SiCN film formed on the surface were prepared. On the SiN film and on the SiCN film, a BN film and a B—Si film were continuously formed under a vacuum atmosphere using the processing apparatus 100 described above. The silicon wafer on which the B—Si film was formed was then heat treated at 550° C. for 30 minutes.

The film forming conditions for the BN film were as follows.

10% $B_2H_6/H_2$ gas flow rate: 700 sccm
$NH_3$ gas flow rate: 100 sccm
film-forming temperature: 300° C.
processing chamber pressure: 0.5 Torr (66.7 Pa)
film thickness: 20 nm The film forming conditions for the B—Si film were as follows.

Figure 6A:
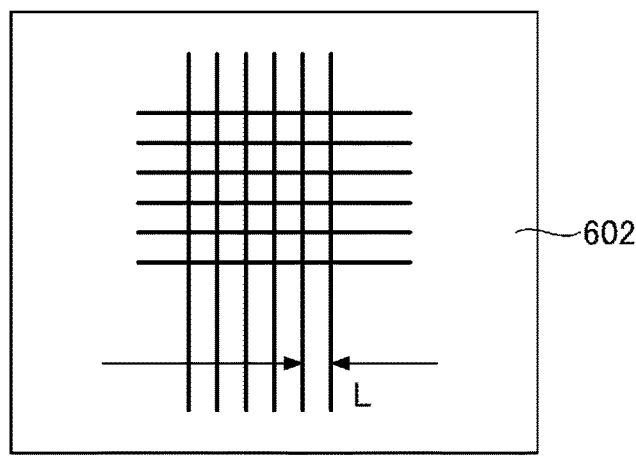
FIGS. 6A to 6C are diagrams illustrating a method of evaluating adhesion of the B—Si film.
Figure 6B:
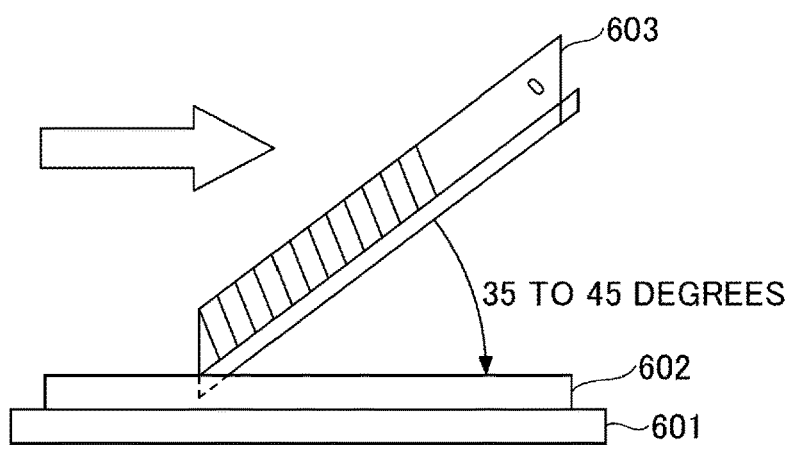
Figure 6C:
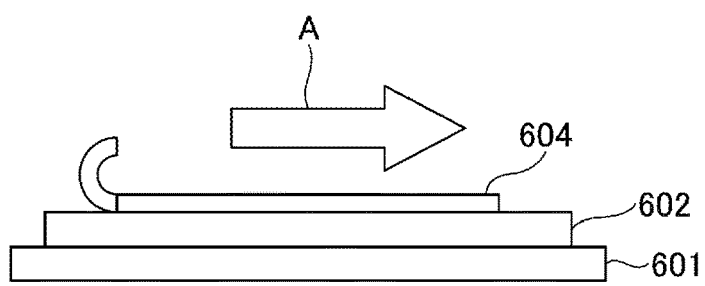

10% $B_2H_6/H_2$ gas flow rate: 800 sccm
$SiH_4$ gas flow rate: 666 sccm
film-forming temperature: 250° C.
processing chamber pressure: 0.5 Torr (66.7 Pa)
film thickness: 580 nm Next, before and after the heat treatment of the silicon wafers, the adhesion of each B—Si film was evaluated by a tape test. In the tape test, using a cutter knife 603, cuts that penetrated the B—Si film 602 and reached the silicon wafer 601 were made in a grid pattern (see FIGS. 6A and 6B). The interval L between adjacent cuts was 2 mm, and the angle of the cutter knife 603 when the cuts were made was 35 degrees to 45 degrees with respect to the B—Si film 602. Then, as illustrated in FIG. 6C, a cut-off cellophane adhesive tape 604 was adhered to the B—Si film 602 that was cut, and the end of the cellophane adhesive tape 604 was pulled off in the direction of arrow A. The presence or absence of film peeling of the B—Si film 602 was observed.

Comparative Example 1 performed for comparison will be described. In Comparative Example 1, a silicon wafer having a SiN film formed on the surface and a silicon wafer having a SiCN film formed on the surface were prepared. Then, without forming a BN film, a B—Si film was formed on the SiN film and the SiCN film using the processing apparatus 100 described above under the same conditions as Example. The silicon wafer on which the B—Si film was formed was then heat treated at 550° C. for 30 minutes. Before and after the heat treatment of the silicon wafers, the adhesion of each B—Si film was evaluated by the same tape test as Example.

Comparative Example 2 performed for the comparison will be described. In Comparative Example 2, a silicon wafer having a SiN film formed on the surface and a silicon wafer having a SiCN film formed on the surface were prepared. Then, an a-Si film and a B—Si film were continuously formed on the SiN film and the SiCN film using the processing apparatus 100 described above under a vacuum atmosphere. The silicon wafer on which the B—Si film was formed was then heat treated at 550° C. for 30 minutes. Before and after the heat treatment of silicon wafers, the adhesion of each B—Si film was evaluated by the same tape test as Example. The a-Si film was formed to have a thickness of 20 nm by supplying $SiH_4$ gas in a state where the silicon wafer was heated to 470° C. The film forming conditions for the B—Si film were the same as those of Example.

FIGS. 7 to 9 illustrate the results of the evaluation of the adhesion of the B—Si film. FIGS. 7 to 9 illustrate the results of Example, Comparative Example 1, and Comparative Example 2, respectively.

As illustrated in FIG. 7, in Example in which the BN film and the B—Si film were continuously formed on the base under a vacuum atmosphere, it was confirmed that the B—Si film did not peel off both before and after the heat treatment, regardless of whether the base was the SiN film or the SiCN film.

In contrast, as illustrated in FIG. 8, in Comparative Example 1 in which the B—Si film was formed without forming the BN film on the base, it was confirmed that the B—Si film peeled off both before and after the heat treatment, regardless of whether the base was the SiN film or the SiCN film.

Further, as illustrated in FIG. 9, in Comparative Example 2 in which the a-Si film and the B—Si film were continuously formed on the base under a vacuum atmosphere, when the base is the SiN film, it was confirmed that the B—Si film did not peel off before the heat treatment, and that the B—Si film peeled off at the bevel after the heat treatment. In Comparative Example 2, when the base was the SiCN film, it was confirmed that the B—Si film did not peel off both before and after the heat treatment.

From the above-described results, it has been demonstrated that by forming the BN film and the B—Si film continuously under a vacuum atmosphere on the base, the B—Si film with a good adhesion can be formed on the base regardless of the type of the base.

The embodiments disclosed herein should be considered to be exemplary in all respects and not limiting. The above embodiments may be omitted, substituted, or changed in various forms without departing from the appended claims.

In the embodiments described above, the processing apparatus is a batch-type apparatus that processes a plurality of substrates at once. The present disclosure is not limited thereto. For example, the processing apparatus may be a sheet-fed apparatus that processes substrates one by one. For example, the processing apparatus may be a semi-batch apparatus in which a plurality of substrates disposed on a rotating table in a processing chamber and the substrates are revolved in accordance with the rotation of the rotating table. The substrates may be processed by passing through a region in which a first gas is supplied and a region in which a second gas is supplied in turn.

According to the present disclosure, a boron-containing silicon film with good adhesion can be formed.

The invention claimed is:

1. A method for forming a film, the method comprising:
forming a boron nitride film on a substrate, and
forming a boron-containing silicon film on the boron nitride film,
wherein a ratio of elements of boron (B) and nitrogen (N) in the boron nitride film is B:50% and N:50%, and
wherein the forming of the boron nitride film is performed under conditions that a 10% $B_2H_6/H_2$ gas flow rate is 700 sccm; an $NH_3$ gas flow rate is 100 sccm; a film-forming temperature is 300° C.; and a processing chamber pressure is 0.5 Torr (66.7 Pa), and then the forming of the boron-containing silicon film on the boron nitride film is performed under conditions that a 10% $B_2H_6/H_2$ gas flow rate is 800 sccm; a $SiH_4$ gas flow rate is 666 sccm; a film-forming temperature is 250° C.; and a processing chamber pressure is 0.5 Torr (66.7 Pa).

2. The method for forming a film according to claim 1, wherein the forming of the boron nitride film and the forming of the boron-containing silicon film are continuously performed under a vacuum atmosphere.

3. The method for forming a film according to claim 2, wherein the forming of the boron nitride film and the forming of the boron-containing silicon film are continuously performed in a same processing chamber.

4. The method for forming a film according to claim 1, further comprising: preparing the substrate such that the substrate has a SiN film or a SiCN film formed on a surface thereof, before the forming of the boron nitride film.

5. The method for forming a film according to claim 1, wherein the forming of the boron nitride film and the forming of the boron-containing silicon film are continuously performed in a same processing chamber.

* * * * *